(12) United States Patent
Stephan et al.

(10) Patent No.: US 7,115,464 B2
(45) Date of Patent: Oct. 3, 2006

(54) SEMICONDUCTOR DEVICE HAVING DIFFERENT METAL-SEMICONDUCTOR PORTIONS FORMED IN A SEMICONDUCTOR REGION AND A METHOD FOR FABRICATING THE SEMICONDUCTOR DEVICE

(75) Inventors: Rolf Stephan, Dresden (DE); Manfred Horstmann, Dresden (DE); Karsten Wieczorek, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 10/259,016

(22) Filed: Sep. 27, 2002

(65) Prior Publication Data

US 2003/0164524 A1 Sep. 4, 2003

(30) Foreign Application Priority Data

Mar. 1, 2002 (DE) .......................... 102 09 059

(51) Int. Cl.
*H01L 21/8238* (2006.01)
*H01L 21/336* (2006.01)
*H01L 21/76* (2006.01)
*H01L 21/3205* (2006.01)

(52) U.S. Cl. ...................... 438/224; 438/231; 438/286; 438/301; 438/305; 438/453; 438/586

(58) Field of Classification Search ................ 438/453, 438/586, 664, 666; 257/384, 413, E21.029, 257/165, 199, 733; 428/231, 224, 286, 301, 428/303, 305, 329, 230

See application file for complete search history.

(56) References Cited

U.S. PATENT DOCUMENTS 4,107,835 A   8/1978   Bindell et al. ................ 29/590
4,897,368 A   1/1990   Kobushi et al. ............ 437/200

(Continued)

FOREIGN PATENT DOCUMENTS

DE   19520782 A1   6/1995
DE   19819438 A1   3/1999
DE   19952177 A1   5/2000

(Continued)

OTHER PUBLICATIONS

Application Ser. No. 10/260,926, entitled "Semiconductor Device Having Different Metal Silicide Portions and Method for Fabricating the Semiconductor Device," filed Sep. 30, 2002.
Application Ser. No. 10/282,720, entitled "Method of Forming Different Silicide Portions on Difference Silicon-Containing Regions in a Semiconductor Device," filed Oct. 29, 2002.

*Primary Examiner*—Long Pham
*Assistant Examiner*—Shrinivas H. Rao
(74) *Attorney, Agent, or Firm*—Williams, Morgan & Amerson (57) ABSTRACT

In a method for fabricating a semiconductor device different types of a metal-semiconductor compound are formed on or in at least two different conductive semiconductor regions so that for each semiconductor region the metal-semiconductor compound region may be formed to obtain an optimum overall performance of the semiconductor device. On one of the two semiconductor regions, the metal-semiconductor compound is formed of at least two different metal layers, whereas the metal-semiconductor compound in or on the other semiconductor region is formed from a single metal layer.

19 Claims, 4 Drawing Sheets

U.S. PATENT DOCUMENTS

| | | | |
|---|---|---|---|
| 5,034,348 A | 7/1991 | Hartswick et al. | 437/200 |
| 5,248,892 A | 9/1993 | Van Roozendaal et al. | 257/357 |
| 5,316,977 A | 5/1994 | Kunishima et al. | 437/200 |
| 5,317,187 A | 5/1994 | Hindman et al. | 257/659 |
| 5,352,631 A | 10/1994 | Sitaram et al. | 437/200 |
| 5,447,875 A | 9/1995 | Moslehi | 437/41 |
| 5,451,545 A | 9/1995 | Ramaswami et al. | 437/200 |
| 5,565,708 A | 10/1996 | Ohsaki et al. | 257/764 |
| 5,738,917 A | 4/1998 | Besser et al. | 427/576 |
| 5,874,342 A | 2/1999 | Tsai et al. | 438/301 |
| 5,899,720 A * | 5/1999 | Mikagi | 438/303 |
| 5,902,129 A | 5/1999 | Yoshikawa et al. | 438/592 |
| 5,937,325 A | 8/1999 | Ishida | 438/655 |
| 5,998,252 A * | 12/1999 | Huang | 438/241 |
| 6,072,222 A * | 6/2000 | Nistler | 257/383 |
| 6,100,173 A | 8/2000 | Gardner et al. | 438/592 |
| 6,136,705 A | 10/2000 | Blair | 343/682 |
| 6,187,617 B1 | 2/2001 | Gauthier, Jr. et al. | 438/197 |
| 6,204,103 B1 | 3/2001 | Bai et al. | 438/224 |
| 6,232,227 B1 | 5/2001 | Mikagi | 438/655 |
| 6,238,986 B1 * | 5/2001 | Kepler et al. | 438/301 |
| 6,261,898 B1 * | 7/2001 | Wu | 438/241 |
| 6,268,255 B1 | 7/2001 | Besser et al. | 438/303 |
| 6,281,067 B1 * | 8/2001 | Chien et al. | 438/241 |
| 6,306,698 B1 | 10/2001 | Wieczorek et al. | 438/197 |
| 6,328,984 B1 * | 12/2001 | Katsuyama | 424/401 |
| 6,383,878 B1 * | 5/2002 | Huang | 438/299 |
| 6,383,906 B1 * | 5/2002 | Wieczorek et al. | 438/592 |
| 6,391,704 B1 * | 5/2002 | Hong et al. | 438/241 |
| 6,403,423 B1 * | 6/2002 | Weybright et al. | 438/279 |
| 6,451,679 B1 * | 9/2002 | Hu et al. | 438/592 |
| 6,468,904 B1 * | 10/2002 | Chen et al. | 438/682 |
| 6,528,401 B1 * | 3/2003 | Bae et al. | 438/592 |
| 6,528,422 B1 * | 3/2003 | Huang et al. | 438/683 |
| 6,531,724 B1 * | 3/2003 | Furukawa et al. | 257/288 |
| 6,534,402 B1 * | 3/2003 | Liao | 438/659 |

FOREIGN PATENT DOCUMENTS

| | | | |
|---|---|---|---|
| DE | 19940758 A1 | | 3/2001 |
| EP | 0 199 939 A2 | | 3/1986 |
| EP | 0 417 522 A1 | | 8/1990 |
| JP | 1140679 | * | 6/1989 |
| JP | 05055251 A | | 8/1991 |
| JP | 2002025940 A | | 1/2002 |
| WO | WO 95/15005 | | 6/1995 |
| WO | WO 96/13061 | | 5/1996 |

* cited by examiner

SEMICONDUCTOR DEVICE HAVING DIFFERENT METAL-SEMICONDUCTOR PORTIONS FORMED IN A SEMICONDUCTOR REGION AND A METHOD FOR FABRICATING THE SEMICONDUCTOR DEVICE

BACKGROUND OF THE INVENTION

1. Field of the Invention

Generally, the present invention relates to the field of fabrication of integrated circuits and, more particularly, to semiconductor devices having metal-semiconductor compounds on semiconductor regions to reduce the sheet resistance of the semiconductor regions. Furthermore, the present invention relates to a method of manufacturing these semiconductor devices.

2. Description of the Related Art

In modern ultra-high density integrated circuits, device features are steadily decreasing to enhance device performance and functionality. Shrinking the feature sizes, however, entails certain problems that may partially offset the advantages obtained by the reduced feature sizes. Generally, reducing the feature sizes of, for example, a transistor element, leads to a decreased channel resistance in the transistor element and thus results in a higher drive current capability and enhanced switching speed of the transistor. In decreasing the features sizes of these transistor elements, however, the increasing electrical resistance of conductive lines and contact regions, i.e., of regions that provide electrical contact to the periphery of the transistor element, becomes a dominant issue since the cross-sectional area of these lines and regions decreases with decreasing feature sizes. The cross-sectional area, however, determines, in combination with the characteristics of the material comprising the conductive lines and contact regions, the resistance of the respective line or contact region.

The above problems may be exemplified for a typical critical feature size in this respect, also referred to as a critical dimension (CD), such as the extension of the channel of a field effect transistor that forms below a gate electrode between a source region and a drain region of the transistor. Reducing this extension of the channel, commonly referred to as channel length, may significantly improve device performance with respect to fall and rise times of the transistor element due to the smaller capacitance between the gate electrode and the channel and due to the decreased resistance of the shorter channel. Shrinking of the channel length, however, also entails the reduction in size of any conductive lines, such as the gate electrode of the field effect transistor, which is commonly formed of polysilicon, and the contact regions that allow electrical contact to the drain and source regions of the transistor, so that consequently the available cross-section for charge carrier transportation is reduced. As a result, the conductive lines and contact regions exhibit a higher resistance unless the reduced cross-section is compensated by improving the electrical characteristics of the material forming the lines and contact regions, such as the gate electrode, and the drain and source contact regions.

It is thus of particular importance to improve the characteristics of conductive regions that are substantially comprised of semiconductor material such as silicon. For instance, in modern integrated circuits, the individual semiconductor devices, such as field effect transistors, capacitors, and the like, are primarily based on silicon, wherein the individual devices are connected by silicon lines and metal lines. While the resistivity of the metal lines may be improved by replacing the commonly used aluminum by, for example, copper, process engineers are confronted with a challenging task when an improvement in the electrical characteristics of silicon-containing semiconductor lines and semiconductor contact regions is required.

Figure 1A:
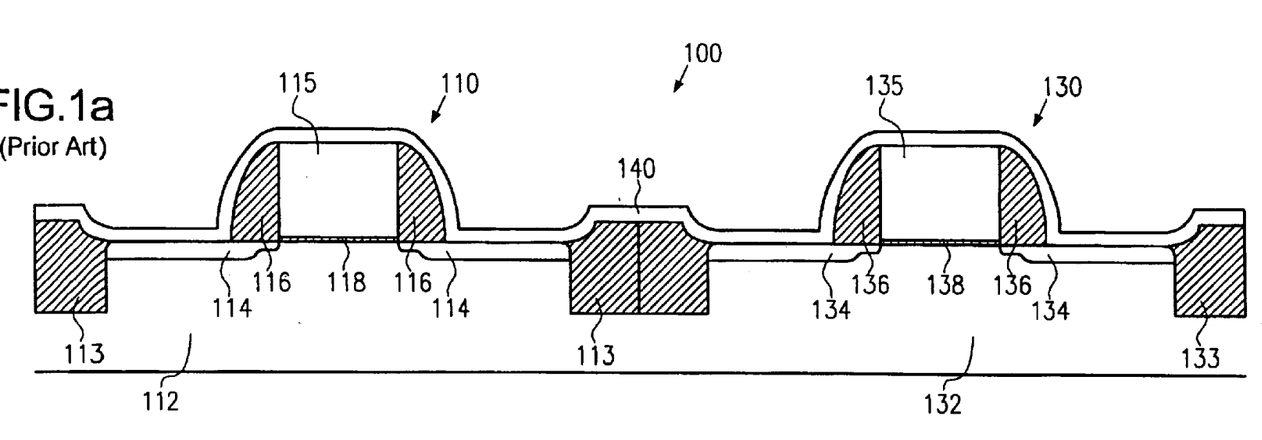
FIGS. 1a–1b schematically show cross-sectional views of a conventionally manufactured semiconductor device.
Figure 1B:
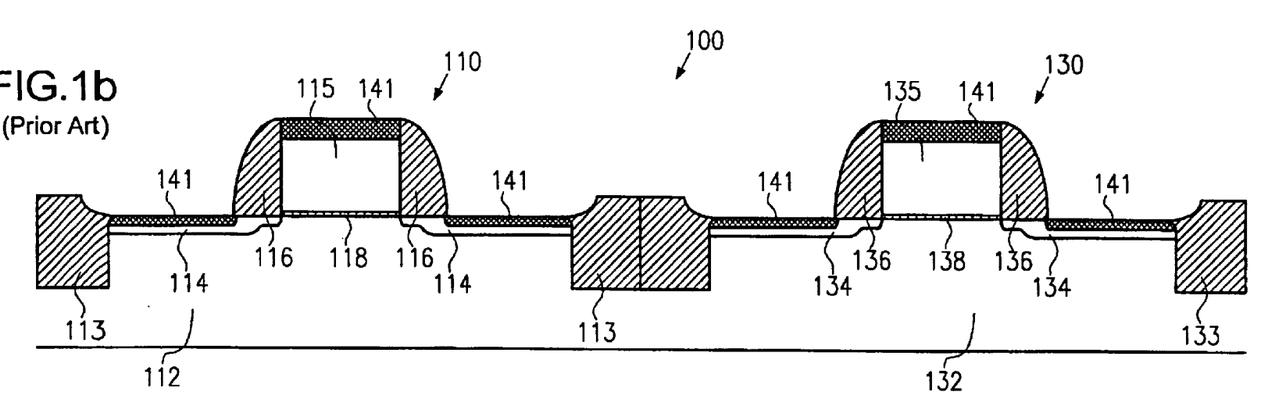

With reference to FIGS. 1a and 1b, an exemplary process for manufacturing an integrated circuit containing, for example, a plurality of MOS transistors, will now be described in order to illustrate the problems involved in improving the electrical characteristics of silicon-containing semiconductor regions in more detail.

In FIG. 1a, a semiconductor structure 100 includes a substrate 101, for example, a silicon substrate, in which a first semiconductor element 110 and a second semiconductor element 130 are formed. The first semiconductor element 110 may, as depicted in FIG. 1a, represent a field effect transistor of a first conductivity type, such as an n-channel transistor, and the second semiconductor element 130 may represent a field effect transistor of a second conductivity type, such as a p-channel transistor. The first semiconductor element 110 comprises shallow trench isolations (STI) 113 that are formed of an insulated material, such as silicon dioxide, and that define an active region 112 in the substrate 101. A gate electrode 115 is formed over a gate insulation layer 118 that separates the gate electrode 115 from the active region 112. Spacer elements 116 made of, for example, silicon dioxide or silicon nitride, are located at the sidewalls of the gate electrode 115. In the active region 112, source and drain regions 114 are formed and exhibit an appropriate dopant profile required to connect to a conductive channel that builds up between the drain and the source region during operation of the first semiconductor element 110.

The second semiconductor element 130 comprises substantially the same parts as the first semiconductor element 110 and corresponding parts are denoted by the same reference numerals except for a "leading 13" instead of a "leading 11." As previously noted, the second semiconductor element 130 may differ from the first semiconductor element 110 in, for example, type of conductivity, that is, type and concentration of dopants provided in the active regions 112 and 132, lateral extension of the gate electrode, also referred to as gate length, cross-sectional area, and the like. Moreover, it should be noted that although the first and second semiconductor elements 110 and 130 in FIGS. 1a and 1b are depicted as transistor elements, the first and second semiconductor elements 110 and 130 may represent any silicon-containing region that is used for charge carrier transportation. For example, relatively long polysilicon lines may connect semiconductor elements on different locations of a single chip area and these polysilicon lines may be regarded as first and second semiconductor elements 110, 130, the electrical characteristics of which are to be improved so as to obtain an enhanced device performance with respect to signal propagation delay.

Again referring to FIG. 1a in particular, the gate length of the first and second semiconductor elements 110 and 130 determines the channel length of these devices and, therefore, as previously pointed out, significantly affects the electrical characteristics of the first and second semiconductor elements 110 and 130, whereby a reduced gate length will result in an increased resistance of the gate electrodes 115, 135 owing to the reduction of the cross-sectional area of the gate electrodes 115, 135.

A typical process flow for forming the semiconductor structure 100 may comprise the following steps. After the formation of the shallow trench isolations 113 and 133 by well-known photolithography techniques, implantation steps are performed to create a required dopant concentration in the active regions 112 and 132. Subsequently, the gate insulation layers 118 and 138 are formed according to design requirements. Thereafter, the gate electrodes 115 and 135 are formed by patterning, for instance a polysilicon layer, by means of sophisticated photolithography and etch methods. Then, a further implantation step for forming so-called source and drain extensions within the source and drain regions 114 and 134 is performed and the spacer elements 116 and 126 are formed by deposition and anisotropic etching techniques. The spacer elements 116 and 126 are used as an implantation mask for a subsequent implantation step in which dopant ions are implanted into the source and drain regions 114 and 134 to create the required high dopant concentrations in these regions. It is to be noted that the dopant concentration varies in FIG. 1a in the horizontal direction, i.e., in the length direction of the gate electrodes 115, 135, as well as in the vertical direction, which will hereinafter be referred to as depth direction. Although the dopant profile of the source and drain regions 114 and 134 is depicted as a region having a sharp boundary, in reality the dopant profile varies continuously due to the nature of the implantation process and the subsequent annealing steps that are performed for activating the implanted atoms and for curing the crystalline damage caused by the implantation step. Usually, the dopant profile has to be selected in conformity with other parameters of the first and second semiconductor elements 110 and 130. For example, a short gate length, and thus a short channel length, requires a "shallow" dopant profile in order to avoid the so-called "short channel effect." Accordingly, the peak concentration in the depth direction may be located a few hundred nanometers below the surface of the drain and source regions 114 and 134. Moreover, p-channel transistors may require a different dopant profile than an n-channel transistor element.

As previously noted, the cross-section of the gate electrodes 115 and 135, which may be considered as polysilicon lines, as well as the contact area on top of the source and drain regions 114 and 134, significantly influence the electrical characteristics of the first and second semiconductor elements 110 and 130. Since, generally, these device areas primarily contain a semiconductor material, such as silicon in crystalline, polycrystalline and amorphous form, these areas, although they usually include dopants, exhibit a relatively high resistance compared to, for example, a metal line. Consequently, these areas are treated to enhance the conductivity of these regions, thereby improving the overall performance of the devices.

To this end, according to FIG. 1a, a metal layer 140 is deposited over the first and second semiconductor elements 110 and 130. Typically, the metal layer 140 comprises titanium, cobalt, or other refractory metals. Subsequently, a first heat treatment, for example, a rapid thermal annealing, is carried out to initiate a chemical reaction between the silicon in the source and drain regions 114, 134, the gate electrodes 115, 135, and the metal contained in the metal layer 140. If, for example, the metal layer 140 substantially comprises cobalt, an average temperature of the first heat treatment may be set to about 400° C. to create a meta-stable cobalt silicon compound exhibiting a relatively high resistivity. Since the silicon contained in the spacer elements 116, 136 and the shallow trench isolations 113, 133 is chemically bound in the form of dioxide or nitride, the metal of the metal layer 140 does not substantially react with the material of the spacer elements 116, 136 and the shallow trench isolations 113, 133. After the first heat treatment, the material of the metal layer 140 that has not reacted with the underlying material is removed by, for example, a selective wet etching process. Thereafter, a second heat treatment is performed, for example, a second rapid annealing step with a temperature higher than in the first annealing step, to convert the meta-stable metal-silicon compound into a metal silicide. In the above example, when cobalt is used, a cobalt disilicide is formed in the second annealing step. The metal silicide shows a significantly lower resistance than the meta-stable metal-silicon compound as well as a significantly lower resistance, by a factor of about 5–10, than the sheet resistance of the doped polysilicon.

FIG. 1b schematically shows the finally obtained first and second semiconductor elements 110 and 130 having formed on the respective source and drain regions 114, 134 and the gate electrodes 115, 135 a metal suicide region 141. Although the metal suicide regions 141 significantly improve the electrical characteristics of the first and second semiconductor elements 110 and 130, there is still room for improvement since, in the conventional process flow, the metal suicide regions 141 have to be formed so as to meet the requirements of the first semiconductor element 110 and the second semiconductor element 130, so that optimizing the characteristics of the suicide regions 141 of the first semiconductor element 110 compromises the effect of the silicide regions 141 of the second semiconductor element 130, and vice versa.

It is thus desirable to have a semiconductor and a method of forming the same in which the characteristics of the conductive semiconductor regions may be individually optimized for different semiconductor elements.

SUMMARY OF THE INVENTION

Generally, the present invention is directed to a method for forming different metal silicides on various conductive semiconductor regions, wherein at least one conducive semiconductor region receives a first metal-semiconductor compound and a further conductive semiconductor region receives the first metal-semiconductor compound and at least one second metal-semiconductor compound, wherein the first and second metal-semiconductor compounds are individually tailored to yield the desired electrical characteristics for the respective conductive semiconductor region.

According to one illustrative embodiment, a method of fabricating a semiconductor device comprises providing a substrate having formed thereon a first conductive semiconductor region and a second conductive semiconductor region. Moreover, a first metal layer is deposited on the first and second conductive semiconductor regions and a mask layer is formed on the substrate to expose the second conductive semiconductor region. Thereafter, the metal is removed from the second conductive semiconductor region and the substrate is thermally annealed to form a first compound of the first metal with the material of the first conductive semiconductor region. Additionally, the method comprises depositing a second metal layer on the first and second conductive semiconductor regions and thermally annealing the substrate to form a second compound of the second metal layer with the material of the second conductive semiconductor region.

According to a further illustrative embodiment, a method of forming a semiconductor device comprises providing a substrate having formed thereon a first semiconductor region and a second semiconductor region, the first and second semiconductor regions comprising silicon. A first metal layer is deposited on the first and second semiconductor regions. Moreover, the method comprises selectively removing the first metal layer from the second semiconductor region and depositing a second metal layer on the first and the second semiconductor regions. Additionally, the substrate is subjected to a heat treatment in order to at least partially transform the first and second metal layers into metal silicides on the first and second semiconductor regions.

According to a further embodiment, a semiconductor device comprises a semiconductor layer including at least two conductive regions separated from each other by an insulating element. The semiconductor device further comprises a first metal compound formed on one of the at least two conductive regions, and the first metal compound and the second metal compound formed on the other one of the at least two conductive regions.

Pursuant to a further illustrative embodiment, a semiconductor device comprises at least one first transistor element and at least one second transistor element, the first and the second transistor elements formed on a common material layer and separated by an insulating element. Moreover, a first metal compound is formed on source, drain and gate electrode regions of the at least one first transistor element, and the first metal compound and a second metal compound are formed on source, drain and gate electrode regions of the at least one second transistor element, wherein the at least one first transistor element and the at least one second transistor element differ from each other in at least one type of conductivity and gate length.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 2A:
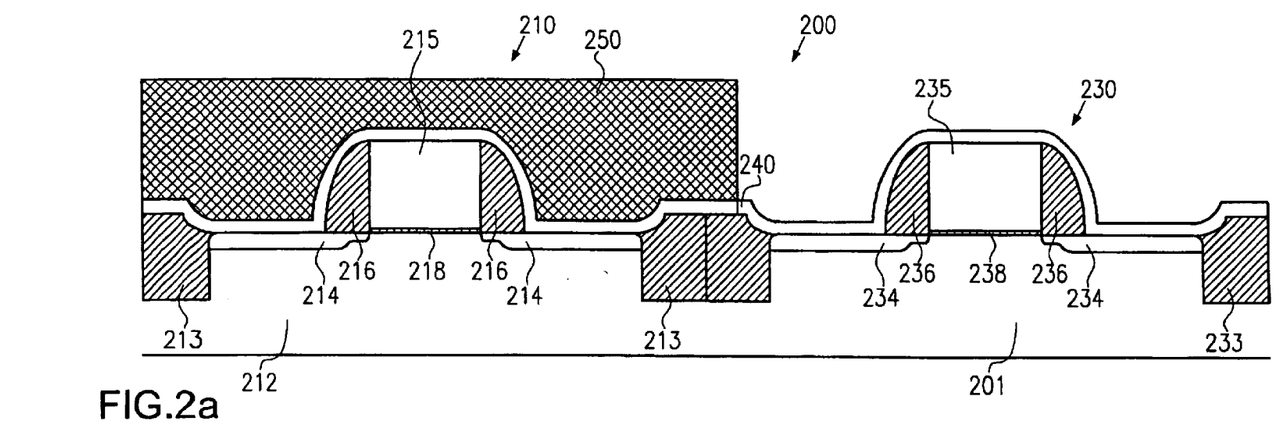
FIGS. 2a–2e schematically show cross-sectional views of a semiconductor device during various manufacturing stages in accordance with one embodiment of the present invention.

With reference to FIGS. 2a–2e, illustrative embodiments of the present invention will now be described. In FIG. 2a, a semiconductor device 200 comprises a first semiconductor element 210 and a second semiconductor element 230. The first semiconductor element 210 comprises an active region 212 that is defined by shallow trench isolations 213. Source and drain regions 214 are formed in the active region 212 and a gate electrode 215 is formed over the active region 212 with a gate insulation layer 218 located between the active region 212 and the gate electrode 215. Spacer elements 216 are formed at the sidewalls of the gate electrode 215 and a metal layer 240 is deposited over the first and second semiconductor elements 210 and 230.

The second semiconductor element 230 comprises essentially the same components as the first semiconductor element 210, wherein corresponding parts are indicated by the same reference numerals except for a leading "23" instead of a leading "21." Contrary to the first semiconductor element 110 in FIG. 1a, the first semiconductor element 210 additionally comprises a resist mask 250 that substantially completely covers the first semiconductor element 210.

A typical process flow for forming the first and second semiconductor elements 210 and 230 may be substantially equal to the process flow as described with reference to FIG. 1a, except for the formation of the resist mask 250, and, therefore, a detailed description of these processes will be omitted.

Regarding the first and second semiconductor elements 210, 230, these elements may represent a first and a second field effect transistor element, such as an n-channel transistor and a p-channel transistor, differing from each other by the type of conductivity and thus by the type of dopants and by the depth profile of the dopants. Moreover, the first and second semiconductor elements 210 and 230 may differ from each other by their respective gate lengths. For example, the first semiconductor element 210 may represent a short channel transistor having a gate length on the order of 0.1 micrometer, and the second semiconductor element 230 may represent a long channel transistor element having a gate length on the order of 1 micrometer. Furthermore, although the first and second semiconductor elements 210 and 230 are depicted in FIGS. 2a–2e as being located adjacent to each other, the first semiconductor element 210 may be located in a first area (not shown) of the substrate 201, whereas the second semiconductor element 230 may be located in a second area (not shown) of the substrate 201 that is spaced apart from the first area and electrically connected therewith with respective conductive lines (not shown). For example, the first semiconductor element 210 may represent an element required for establishing a circuitry in the first area, such as a "CPU" area where a high switching speed of the transistor elements is required, whereas the second semiconductor element 230 may represent an element for establishing a circuitry in the second area where low power consumption and a minimum leakage current is essential, such as a "memory" area.

Moreover, although not shown in FIGS. 2a–2e, the first semiconductor element 210 may represent a single or a plurality of conductive lines, for example formed of polysilicon, having a specified cross-sectional area that depends on design rules or the distance to a neighboring line—for instance, closely spaced lines may exhibit a smaller cross-section than a single isolated line. Similarly, the second semiconductor element 230 may represent a different type of conductive line made of polysilicon exhibiting a cross-sectional area that differs from the cross-sectional area of the first semiconductor element 210. Thus, for enhancing the electrical conductivity of the first and the second semiconductor elements 210 and 230, the metal compound to be formed on the conductive surfaces of these elements may be specifically designed to meet the desired requirements without compromising the electrical conductivity of the other semiconductor element. Therefore, the type of material of the metal layer 240, the thickness of the metal layer 240 and the like is tailored to obtain optimum results when a metal compound is formed on the drain and source regions 214 and the gate electrode 215. To this end, the resist mask 250 is patterned by photolithography to substantially cover the first semiconductor element 210. The photolithography process involved in forming the resist mask 250 is not critical with respect to overlay sensitivity, since the exact location of the edge of the photoresist mask 250 on the shallow trench isolations 213 does not need to be defined with high precision.

Figure 2B:
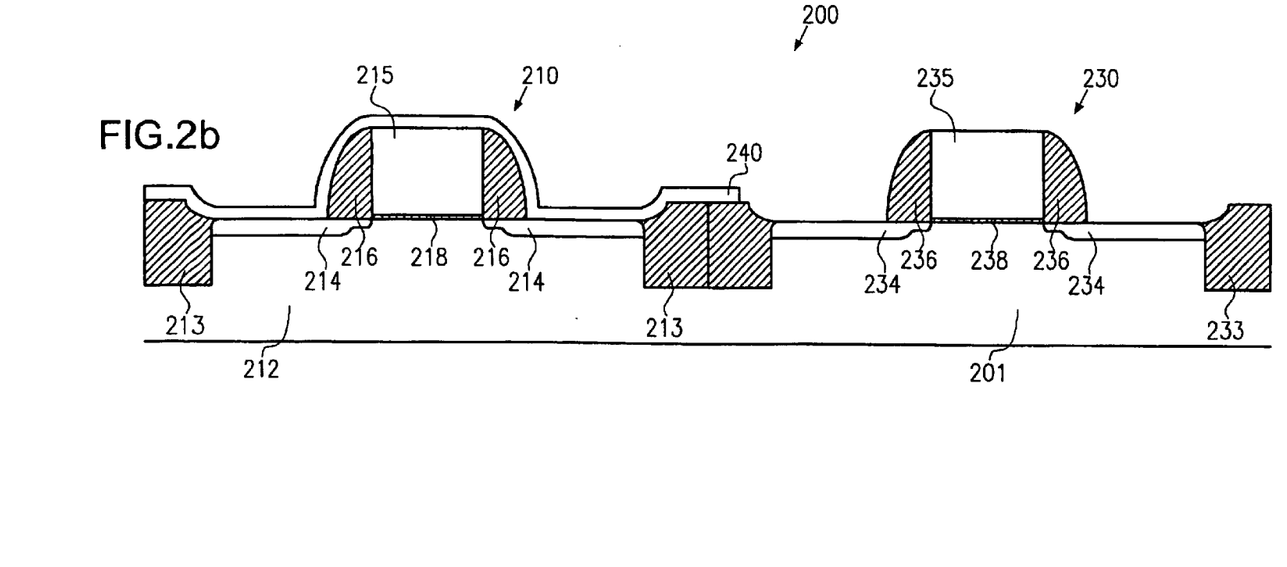

FIG. 2b shows the device of FIG. 2a with the metal layer 240 removed from the second semiconductor element 230 and with the photoresist mask 250 removed from the first semiconductor element 210.

Figure 2C:
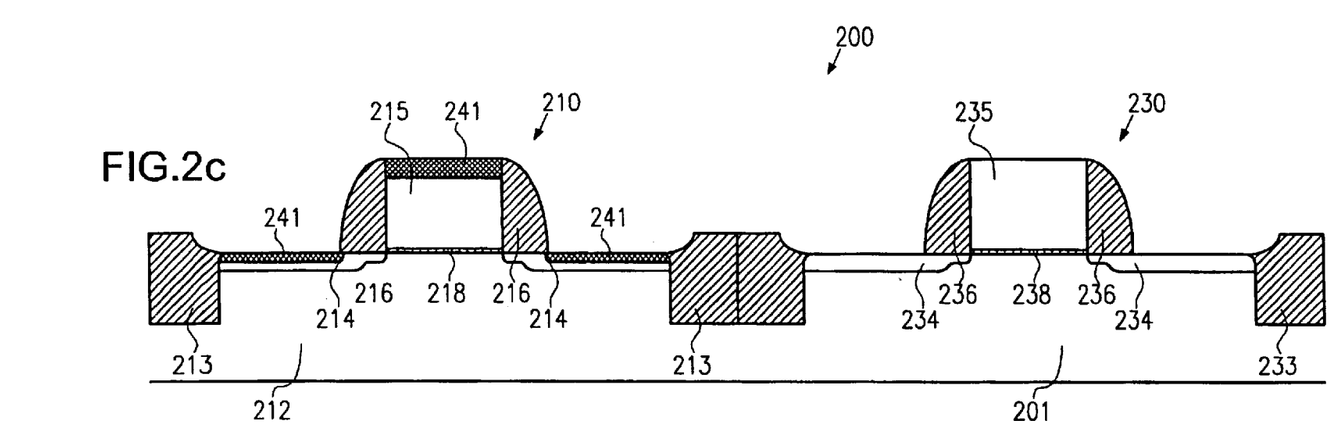

Referring to FIG. 2c, the first semiconductor element 210 includes regions 241 of a metal compound formed on the surfaces of the source and drain regions 214 and the gate electrode 215. Starting from the structures shown in FIG. 2b, a first annealing step may be performed so as to initiate a chemical reaction between the metal layer 240 and the material in the semiconductor regions, such as the source and drain regions 214 and the gate electrode 215. Depending on the type of semiconductor material and the type of material in the metal layer 240, the process conditions of the annealing step are correspondingly selected. For example, if the first semiconductor element 210 is a short channel transistor element, preferably the metal layer 240 may be comprised substantially of cobalt and the average temperature during the first annealing step is selected to be approximately 400–500° C. to initiate diffusion of the atoms and cause a chemical reaction of the semiconductor material and the cobalt in the metal layer 240. When the semiconductor material in the source and drain regions 214 and the gate electrode 215 is substantially comprised of silicon, a cobalt silicon compound is formed during the first annealing step. In another illustrative embodiment, the metal layer may be substantially comprised of titanium, particularly when the first semiconductor element 210 is a long channel transistor element. In a long channel transistor, the gate length is increased and the formation of titanium silicide agglomerations during the chemical reaction between the silicon in the semiconductor material and the titanium, as is the case in gate electrodes having a gate length on the order of 0.5 µm and beyond, does not essentially create an adverse effect on the quality of the final line or contact region. Accordingly, for a titanium-based metal layer, a higher temperature may be selected in the first annealing step. In further embodiments, other refractory metals, such as zirconium, tantalum, tungsten, nickel or any alloys of the metals mentioned so far, without limiting the present invention to these materials, may be used. Moreover, even compounds containing noble metals or pure noble metals may be used as the metal layer 240. Moreover, the metal layer 240 may be provided as a bi-layer or multi-layer, for example, as a cobalt layer having a thin top layer of titanium, titanium nitride and the like, to adjust the properties of the metal layer 240 to meet the requirements in the formation of the metal compound in the source and drain regions 214 and the gate electrode 215. In one embodiment, the metal layer 240 may be selected as a bi-layer, in case a semiconductor compound, for example, a silicon germanium semiconductor, is provided in the first semiconductor element 210.

After the first annealing step, the excess material of the metal layer 240 which has not reacted with the underlying material is removed by wet-etching or dry-etching, wherein the metal in the metal layer 240 does not substantially react with the insulating materials of the spacer elements 216 and the shallow trench isolations 213. After removing the excess metal of the metal layer 240, a second annealing step is carried out at a higher average temperature than during the first annealing step. During this second annealing step, the semiconductor-metal compound is converted into a stable phase metal silicide exhibiting a significantly lower resistivity than the meta-stable phase after the first annealing step. For example, if cobalt and/or titanium are primarily contained in the metal layer 240, and silicon is a substantial component of the semiconductor regions to be furnished with a metal compound, the cobalt and/or titanium compound is transformed in a cobalt and/or titanium disilicide that exhibits a substantially lower electrical resistance than the initial silicon-containing semiconductor regions 214 and 215.

Figure 2D:
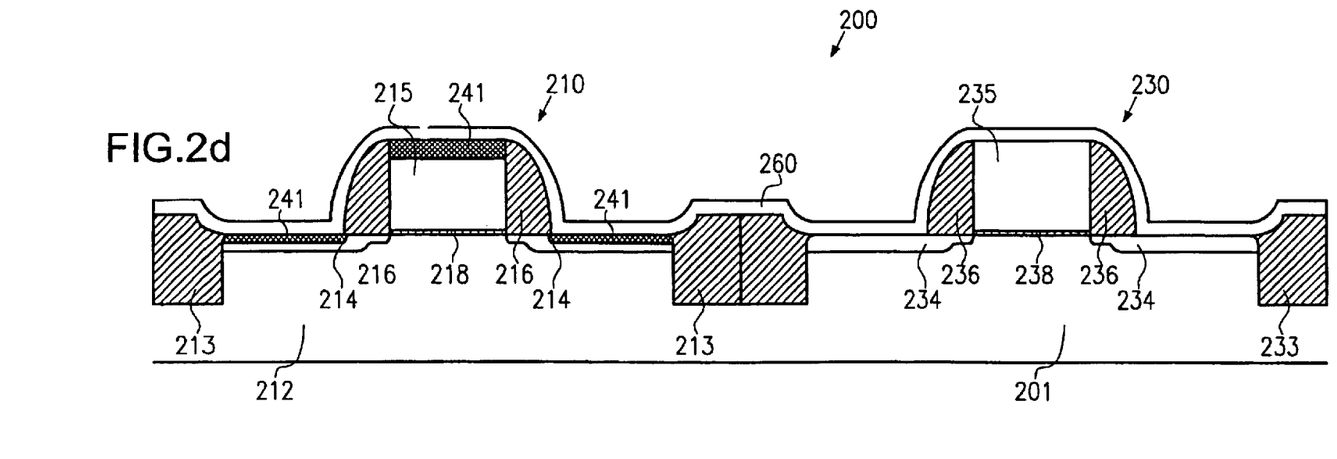

FIG. 2d schematically shows the device of FIG. 2c after a second metal layer 260 has been deposited over the semiconductor structure 200. The type of metal contained in the second metal layer 260 and the thickness of the second metal layer 260 is selected to meet the requirements for a minimum sheet resistance of the regions 234 and 235 of the second semiconductor element 230. For instance, the type of material comprising the second metal layer 260 may be selected to result in a minimized potential barrier between the metal semiconductor compound to be formed and the semiconductor material in the regions 234 and 235. Similarly, the type of metal contained in the first metal layer 240 may be selected so as to obtain a minimum potential barrier in the regions 214 and 215 after completion of the regions 241. Since, in general, the potential barrier depends on the type of dopants and the dopant concentration, different materials are selected for the first and the second metal layers 240, 260 to obtain an optimum result. Alternatively or additionally to an optimum potential barrier, other aspects may be contemplated in selecting the materials comprising the first and the second metal layers 240 and 260. As previously discussed, for example, the gate length of the first and/or second semiconductor elements 210 and 230 may represent a criterion for using a certain material for the first and the second metal layers 240 and 260, respectively. For instance, for a gate length exceeding 0.5 micrometers, titanium may be the preferred material for the first or second metal layers, since any agglomeration of titanium disilicide is of no concern in a gate electrode exceeding the above gate lengths and for titanium layers well-established process techniques are readily available. A different material, such as cobalt and the like, may then be selected for the second metal layer 260.

After deposition of the second metal layer 260, a third annealing step is performed to initiate diffusion and chemical reaction of the material in the second metal layer 260 with the underlying semiconductor material in the regions 234 and 235, and with the metal-semiconductor compound in the regions 214 and 215. Thereafter, the metal of the second metal layer 260, which has not reacted with the underlying material, is selectively removed, and a fourth annealing step is subsequently performed to convert the metal-semiconductor compound into a stable metal-semiconductor compound, for example, in a disilicide if silicon is the primary semiconductor component of the regions 234, 214 and 235, 215.

Figure 2E:
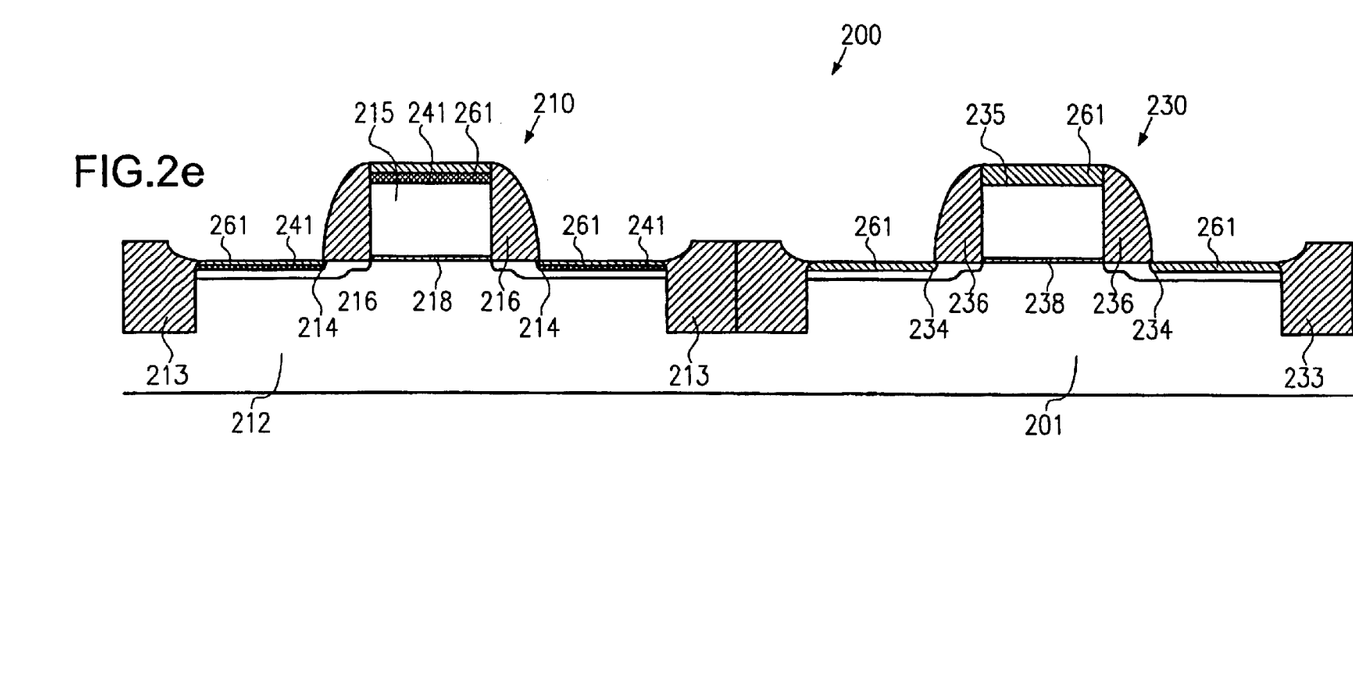

As shown in FIG. 2e, the second semiconductor element 230 comprises metal-semiconductor compound regions 261 on top of the source and drain regions 234 and the gate electrode 235. Moreover, the first semiconductor element 210 additionally comprises metal-semiconductor regions 261 on the metal-semiconductor regions 241.

In forming the metal-semiconductor regions 261, generally a diffusion takes place of the metal atoms and/or the atoms comprising the semiconductor material. Accordingly, although the surface portions of the regions 214 and 215 of the first semiconductor element 210 are covered by the semiconductor-metal regions 241, the regions 261 may be built up on top or within the regions 241, depending on the specific properties of the metal in the second metal layer 260. If a refractory metal is selected for the metal layer 260, the diffusion activity of the metal atoms in the second metal layer 260 will commonly be reduced compared to the diffusion activity of the semiconductor material and/or the material in the region 241. Accordingly, the regions 261 will subsequently be formed on top of the regions 241, whereby the regions 241 are "driven" into the regions 214 and 215. Thus, the first semiconductor element 210 may exhibit regions 214 and 215 having a thicker overall metal-semiconductor compound and thus a lower resistivity than the corresponding regions in the second semiconductor element 230. Moreover, particularly in the first semiconductor element 210, the composition and annealing process parameters may be selected so as to yield, in combination with the formation process of the regions 261, an optimum penetration depth of the regions 241. If, for example, the first and second metal layers 240 and 260 are selected so that the final metal compound regions 241 and 261, in combination, have a thickness that exceeds the thickness in the second semiconductor element 230, the reduced electrical conductivity of a p-channel transistor element compared to an n-channel transistor element may be at least partially compensated for so that the overall drive current capability and the switching time of a complimentary transistor pair is enhanced.

As pointed out earlier, in a similar fashion, any two conductive semiconductor regions that require a different type of metal compound so as to obtain an improved performance, either individually or in combination, may be provided with correspondingly designed metal compound regions. For instance, for two polysilicon lines that need to exhibit essentially the same signal propagation delay time and the cross-sectional areas of the two polysilicon lines significantly differ from each other owing to design requirements, each of the two polysilicon lines may receive an accordingly designed metal-semiconductor compound region, such as the regions 261, 241 in the first semiconductor element 210 and the regions 261 in the second semiconductor element 230, to provide for a substantially identical line resistance.

In a further embodiment, the first and second annealing steps for forming the regions 241 in FIG. 2c may be omitted and the second metal layer 260 may immediately be deposited on the first metal layer 240 and the second semiconductor element 230. Subsequently, a first annealing step is performed to commonly convert the metals in the first and second metal layers 240 and 260 on the first semiconductor element 210 in a corresponding metal-semiconductor compound and to convert the metal of the second metal layer 260 into a corresponding metal-semiconductor compound on the second semiconductor element 230. Afterwards, the same procedure is carried out as already described with reference to FIG. 2e, to obtain the first and second semiconductor elements 210 and 230 having the regions 241 and 261 as depicted in FIG. 2e. This process technique will substantially not increase the thermal budget in manufacturing the device.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of fabricating a semiconductor device, the method comprising:

providing a substrate having formed thereon at least one first transistor and at least one second transistor, each of said first and second transistors being comprised of a gate electrode and a plurality of source/drain regions;

depositing a first metal layer on the at least one first and second transistors; forming a mask layer above the first metal layer wherein the first metal layer above the at least one second transistor is exposed;

removing the first metal layer from above the at least one second transistor;

performing at least one heat treating process on the first metal layer to form a first metal silicide compound on the gate electrode and the source/drain regions of the at least one first transistor;

depositing a second metal layer over the at least one first and second transistors; and performing at least one heat treating process on the second metal layer to form a second metal silicide compound on at least one of the gate electrode and the source/drain regions of the at least one second transistor.

2. The method of claim 1, wherein said first metal layer and said second metal layer differ from each other in at least one of type of material and layer thickness.

3. The method of claim 1, wherein said first and second metal layers comprise at least one of cobalt, titanium, tantalum, tungsten, nickel, zirconium, an alloy thereof and a combination thereof.

4. The method of claim 1, wherein performing at least one heat treating process on said first metal layer comprises:

performing a first annealing step with a first average temperature for a first time interval;

selectively removing material of the first metal layer that has not reacted with the underlying material; and performing a second annealing step at a second average temperature for a second time interval, wherein the first temperature is lower than the second temperature.

5. The method of claim 1, wherein performing at least one heat treating process on said second metal layer comprises:

performing a first annealing step at a first average temperature for a first time interval;

selectively removing the material of the second metal layer that has not reacted with the underlying material; and performing a second annealing step at a second average temperature for a second time interval, wherein the first temperature is lower than the second temperature.

6. The method of claim 4, wherein said first and second average temperatures and said first and second time intervals are controlled so as to adjust the depth of said first metal suicide compound.

7. The method of claim 5, wherein said first and second average temperatures and said first and second time intervals are controlled so as to adjust the depth of said second metal silicide compound.

8. The method of claim 1, wherein at least one of the gate electrode and source/drain regions of said first and second transistors comprises at least one of silicon and germanium.

9. The method of claim 1, wherein said source/drain regions of said first and second transistors differ from each other by at least one of crystalline structure, dopant concentration, dopant profile in a depth dimension and cross-section area.

10. The method of claim 1, wherein said first and second transistors differ from each other in at least one of type of channel conductivity and gate length.

11. A method of fabricating a semiconductor device, the method comprising:

providing a substrate having formed thereon at least one first transistor and at least one second transistor, each of said transistors being comprised of a gate electrode and a plurality of source/drain regions;

depositing a first metal layer on the at least one first and second transistors;

selectively removing the first metal layer from above the at least one second transistor;

depositing a second metal layer on the at least one first and second transistors; and performing at least one heat treating process to form a first metal silicide compound on at least one of the gate electrode and the plurality of source/drain regions of said first transistor and a second metal silicide compound on at least one of the gate electrode and the source/drain regions of said second transistor.

12. The method of claim 11, wherein selectively removing the first metal layer includes forming a mask layer above said first metal layer to expose the first metal layer above said at least one second transistor, and selectively etching said first metal layer above said at least one second transistor.

13. The method of claim 11, wherein performing at least one heat treating process comprises:

performing a first annealing step at a first average temperature for a first time interval;

selectively removing material of the first and the second metal layers that has not reacted with the underlying material; and performing a second annealing step at a second average temperature for a second time interval, wherein the first temperature is less than the second temperature.

14. The method of claim 13, wherein said first and second average temperatures and said first and second time intervals are controlled so as to adjust the depth of said first and second metal silicide compounds.

15. The method of claim 11, wherein said first and second metal layers differ from each other by at least one of layer thickness and type of material.

16. The method of claim 11, wherein said first and second metal layers comprise at least one of cobalt, titanium, tantalum, zirconium, tungsten, nickel, an alloy thereof and any combination thereof.

17. The method of claim 11, wherein at least one of said first and second metal layers comprise at least one noble metal.

18. The method of claim 11, wherein the source/drain regions of said first and second transistors differ from each other in at least one of crystalline structure, type of dopant, dopant concentration, dopant profile in a depth dimension and cross-section area.

19. The method of claim 11, wherein said first and second transistors differ from each other in at least one of type of channel conductivity and gate length.

* * * * *